United States Patent
Shin (10) Patent No.: US 9,219,148 B2
(45) Date of Patent: Dec. 22, 2015

(54) SEMICONDUCTOR DEVICE AND FABRICATING METHOD THEREOF

(71) Applicant: Magnachip Semiconductor, Ltd., Cheongju-si (KR)

(72) Inventor: Hyun Kwang Shin, Gumi-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 13/920,634

(22) Filed: Jun. 18, 2013

(65) Prior Publication Data

US 2014/0054690 A1 Feb. 27, 2014

(30) Foreign Application Priority Data

Aug. 23, 2012 (KR) .................. 10-2012-0092612

(51) Int. Cl.
*H01L 29/78* (2006.01)
*H01L 21/28* (2006.01)
*H01L 29/40* (2006.01)
*H01L 29/66* (2006.01)
*H01L 29/417* (2006.01)
*H01L 29/45* (2006.01)

(52) U.S. Cl.
CPC ...... *H01L 29/7827* (2013.01); *H01L 21/28273* (2013.01); *H01L 29/407* (2013.01); *H01L 29/66734* (2013.01); *H01L 29/7813* (2013.01); *H01L 21/28238* (2013.01); *H01L 29/41766* (2013.01); *H01L 29/456* (2013.01)

(58) Field of Classification Search
CPC ............ H01L 29/7813; H01L 29/4236; H01L 29/0696; H01L 29/4238; H01L 29/407
USPC .................................. 257/329–333, 341–342
See application file for complete search history.

(56) References Cited

U.S. PATENT DOCUMENTS

| | | | | |
|---|---|---|---|---|
| 2006/0006460 A1* | 1/2006 | Zeng | .............................. | 257/330 |
| 2008/0246081 A1* | 10/2008 | Li et al. | ......................... | 257/331 |
| 2009/0321817 A1* | 12/2009 | Hunt | .............................. | 257/330 |
| 2010/0006928 A1* | 1/2010 | Pan et al. | ...................... | 257/330 |
| 2010/0258855 A1* | 10/2010 | Yilmaz et al. | ................. | 257/328 |
| 2012/0241854 A1* | 9/2012 | Ohta et al. | ..................... | 257/331 |
| 2012/0326229 A1* | 12/2012 | Poelzl et al. | .................. | 257/331 |

* cited by examiner

*Primary Examiner* — Steven Loke
*Assistant Examiner* — Didarul Mazumder
(74) *Attorney, Agent, or Firm* — NSIP Law (57) ABSTRACT

A semiconductor device and a fabricating method thereof are provided, in which the semiconductor device includes a semiconductor substrate with a trench formed therein, a bottom electrode placed at a lower inner portion of the trench, the bottom electrode having an uneven upper surface, an insulating layer formed on an upper portion of the bottom electrode and on a sidewall of the trench, and a top electrode placed at an upper portion of the bottom electrode inside the trench, the top electrode having a top electrode which is uneven, in which the top electrode is so configured that the top electrode is inclined toward a center portion.

24 Claims, 6 Drawing Sheets

SEMICONDUCTOR DEVICE AND FABRICATING METHOD THEREOF

CROSS-REFERENCE TO RELATED APPLICATIONS

This application claims the benefit of priority under 35 U.S.C. §119(a) of Korean Patent Application No. 10-2012-0092612, filed on Aug. 23, 2012, in the Korean Intellectual Property Office, the entire disclosure of which is incorporated herein by reference for all purposes.

BACKGROUND

1. Field

The following description relates to a semiconductor device and a fabricating method thereof, and for example, to a semiconductor device with a gate electrode area increased to reduce the resistance at a gate electrode and thus to improve switching speed, and a fabricating method thereof.

2. Description of Related Art

A trench metal-oxide semiconductor field effect transistor (MOSFET) refers to a certain type of transistor in which a channel is formed vertically, and a gate is formed within a trench positioned between a source and a drain. The trench MOSFET includes a lining of a thin insulating layer such as an oxide layer and filled with conductor such as poly-silicon, and provides a specific low on-resistance value by allowing low electric current flow.

An example of the trench MOSFET includes a thick bottom oxide layer formed on a bottom of a trench, and a gate electrode formed thereon. However, since the thick bottom oxide layer is formed by thermal oxidation, Si-induced stress occurs during the fabricating process. Further, due to performing the oxidation under a heat treatment in a temperature exceeding 1000° C., the already-formed well implant profile may alter during the fabricating process, making it difficult to maintain the initially-intended design. As a result, the performance of the device may deteriorate.

To avoid the heat treatment, a high density plasma chemical vapor deposition (HDP CVD) process may be used instead of the thermal oxidation process. When a HDP CVD process is used, a thick bottom oxide layer is formed within the trench by depositing the oxide layer within the trench of the trench MOSFET. However, the HDP CVD process is not a suitable option in certain circumstances. For example, the HDP CVD process requires expensive equipment, causing an increase in the overall manufacturing cost and in the unit price of the products.

SUMMARY

In one general aspect, there is provided a semiconductor device, including: a semiconductor substrate comprising a trench formed therein; a bottom electrode formed inside the trench; a top electrode formed inside the trench and above the bottom electrode; and an insulating layer separating the top electrode from the bottom electrode, the top electrode having an uneven lower surface.

The uneven lower surface of the top electrode may be inclined toward a center portion of the trench. An upper surface of the bottom electrode may be inclined toward the center portion of the trench. An upper surface of the top electrode may be inclined toward the center portion of the trench.

The uneven lower surface of the top electrode may include a curved surface or a V-shaped surface protruding toward an upper uneven surface of the bottom electrode.

An upper surface of the bottom electrode may have a center area that is depressed toward a bottom surface of the trench.

The bottom electrode may include a undoped poly silicon, and the top electrode may include a doped poly silicon.

The general aspect of the semiconductor device may further include: a sacrificial layer formed on a bottom surface and a lower sidewall of the trench; a burial layer formed above the top electrode in the trench; and a metal barrier layer formed above the burial layer.

The burial layer may include at least one of a high temperature low pressure deposition (LPCVD) oxide layer, a borophosphosilicate glass (BPSG), a phosphosilicate glass (PSG) or a tetraethoxy silane (TEOS) film.

The metal barrier layer may include at least one of titanium (Ti) or titanium nitrate (TiN).

The metal barrier layer may have a multilayer structure.

The general aspect of the semiconductor device may further include a metal electrode formed on the metal barrier layer, the metal electrode comprising aluminum (Al).

The metal barrier layer may be formed in contact with the semiconductor substrate via a contact hole formed in the insulating layer.

The semiconductor substrate may include, at a site where the contact hole is formed: a P-type body contact region contacting the metal barrier layer; one or more N-type source regions contacting the metal barrier layer and formed adjacent to the P-type body contact region, and having a doping characteristic different from that of the P-type body contact region; a body layer formed at a lower portion of the P-type body contact region and the N-type source region; and an epilayer formed at a lower portion of the body layer.

The general aspect of the semiconductor device may further include: a metal electrode formed above the top electrode; and a drain region formed in the semiconductor substrate to form a channel between the metal electrode and the N-type source region.

The insulating layer may include: a poly oxide layer formed on the upper surface of the bottom electrode; and a gate oxide layer formed on a sidewall of the trench.

The poly oxide layer may include an uneven surface formed on the upper surface of the bottom electrode.

The poly oxide layer may be formed during an oxidization of an upper surface of the bottom electrode, and the gate oxide layer may be formed during an oxidization of the semiconductor substrate.

The general aspect of the semiconductor device may further include a sidewall oxide layer formed on a sidewall of the bottom electrode within the trench.

The poly oxide layer may have a thickness equal to, or greater than, that of the gate oxide layer, and the sidewall oxide layer may have a greater thickness than the poly oxide layer and the gate oxide layer.

The general aspect of the semiconductor device may further include a sacrificial bottom oxide layer that is formed on a lower surface of the bottom electrode, and the sidewall oxide layer may have a greater thickness than the sacrificial bottom oxide layer.

In another general aspect, there is provided a method of fabricating a semiconductor device, the method involving: forming a trench in a semiconductor substrate; and forming a bottom electrode and a top electrode inside the trench with an insulating layer disposed therebetween, wherein an upper surface of the bottom electrode has an uneven surface.

In the general aspect of the method, a lower surface of the top electrode may be curved or in a V-shape, and an upper surface of the top electrode may be curved or in a V-shape.

The general aspect of the method may further involve: forming a sacrificial layer on a bottom surface and a lower side wall of the trench before forming the bottom electrode in the trench, forming a burial layer above the top electrode in the trench; and forming a metal burlier layer above the burial layer, in which the forming of the burial layer involves forming at least one of: a high temperature low pressure deposition (LPCVD) oxide layer, a borophosphosilicate glass (BPSG), a phosphosilicate glass (PSG) or a tetraethoxy silane (TEOS) film.

Other features and aspects may be apparent from the following detailed description, the drawings, and the claims.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

In examples of semiconductor devices described below, the surface area of a gate electrode may be increased so as to decrease the resistance of the gate electrode and to, accordingly, improve the switching speed of the semiconductor device. Also described below are examples of fabricating methods of a semiconductor device in which the surface area of the gate electrode is increased so as to decrease the resistance and to improve the switching speed of the semiconductor device.

Figure 1:
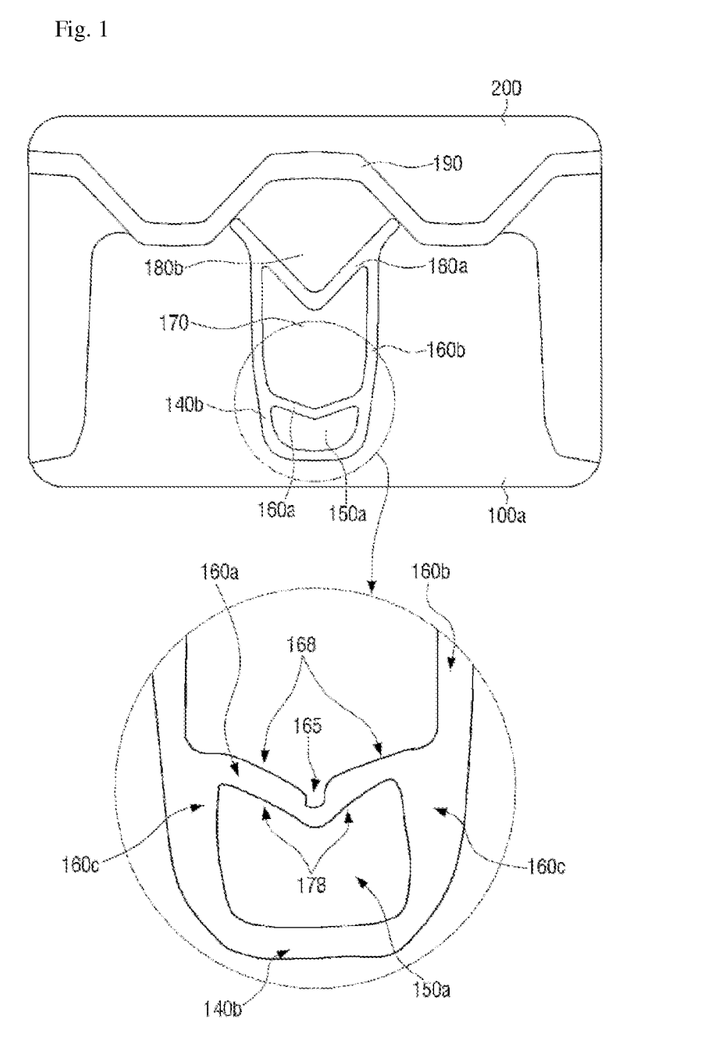
FIG. 1 is a cross-sectional view of a semiconductor device according to a first example, and includes a magnified view of a trench of the semiconductor device.

FIG. 1 illustrates a cross-sectional view of a semiconductor device according to a first example.

Referring to FIG. 1, a semiconductor device according to the first example may include a semiconductor substrate 100a, a sacrificial layer 140b, a bottom electrode 150a, insulating layers 160a, 160b, a top electrode 170, a first burial layer 180a, a second burial layer 180b, a metal barrier layer 190, and a metal electrode 200, and may additionally include a drain region (not illustrated). However, the illustrated semiconductor device is provided only as an example, and the semiconductor device of the present disclosure is not limited thereto. For instance, in other examples, a semiconductor device may include one or more of the semiconductor substrate 100a, the sacrificial layer 140b, the bottom electrode 150a, the insulating layers 160a, 160b, the top electrode 170, the first burial layer 180a, the second burial layer 180b, the metal barrier layer 190, and the metal electrode 200, but may not include all of these elements. Further, the semiconductor device may include additional elements not illustrated in FIG. 1.

In another example of the semiconductor device, the first and second burial layers 180a, 180b may be formed as one single burial layer or be constructed without certain elements such as the metal barrier layer 190, and the like. For convenience of explanation, described below in detail is an example of a semiconductor device in which all of the above-mentioned elements are included.

In the semiconductor device illustrated in FIG. 1, the semiconductor substrate 100a may be a silicon substrate, such as a wafer, or may be a glass or quartz substrate. A trench may be formed in an upper surface of the semiconductor substrate 100a to a predetermined depth by photolithography or etching process. According to one example, the trench may have a width of 0.3~0.5 μm and a depth of 1~3 μm. In another example, the width and depth of the trench may be formed according to a specification that is aimed towards minimizing the semiconductor device, or as to have a desired characteristic as determined by a designer. The numerical values may be also adjusted in accordance with the minimum specification that can be produced by specific processing equipment.

In the illustrated example, the sacrificial layer 140b is formed on a bottom surface and on an inner wall of the trench. In order to reduce loss or damage caused due to the etching of the trench, a first sacrificial layer 130 may be formed on the entire surface of the semiconductor substrate 100a where the trench is formed, and be removed by, for example, wet etching, thereby completely eliminating damaged silicon (Si). Then, the second sacrificial layer 140b may be formed on the entire surface of the semiconductor substrate 100a and partially etched, leaving only the second sacrificial layer 140b inside the trench. The sacrificial layer 140b illustrated in FIG. 1 is thus refers to the second sacrificial layer that remains inside the trench.

The bottom electrode 150a, surrounded by the sacrificial layer 140b, is formed at a lower inner portion of the trench. In this example, the bottom electrode 150a is formed from polysilicon, and may be referred to as a 'floating poly-Si.' The expression 'split poly-Si' refers to the fact that the bottom electrode 150a is disposed below the top electrode 170 or is split from the top electrode 170. The bottom electrode 150a may be referred to as a 'bottom poly-Si'. The use of an undoped poly is preferred to a doped poly for the purpose of ensuring greater resistance. When a material with greater resistance is used, the parasitic capacitance or mirror capacitance formed between the bottom poly-Si and the substrate becomes significantly smaller. Larger parasitic capacitance or mirror capacitance values generate retarded switching speed or increase power loss. For this reason, it is preferred that the bottom poly uses undoped poly-Si. Further, the bottom electrode 150a may have a thickness of 3000~4000 Å.

Referring to the enlarged view of the trench as illustrated in FIG. 1, the bottom electrode 150a has uneven upper surface 178. That is, the upper portion or the upper side of the bottom electrode is not formed with a flat surface. For example, the upper surface 178 may be inclined toward a center of the trench or curved or formed in a V-shape. This configuration reduces the resistance of the gate electrode by maximizing the surface area of the top electrode 170 that faces the bottom electrode 150a, improving the switching characteristic of the semiconductor device. In order to achieve the above-mentioned characteristics, the bottom electrode 150a may be so formed that the upper surface thereof is curved or formed in a V-shape.

The insulating layer is formed on an entire upper surface of the semiconductor substrate 100a, including the upper surface 178 of the bottom electrode 150a and the upper inner wall of the trench. The insulating layers 160a, 160b include a polymer oxide layer and a gate insulating layer. The insulating layers 160a, 160b may play a role of insulating the top electrode 170, which is used as the gate electrode, from the bottom electrode 150a placed therebelow. In the alternative, the insulating layers 160a, 160b may only play a role of the gate insulating layer. In one example, the insulating layers 160a, 160b may be formed into poly oxide layer and silicon oxide layer, respectively. The poly oxide layer 160a that is formed on the bottom electrode 150a having uneven upper surface 168 may also have an uneven lower surface. The uneven lower surface of the poly oxide layer 160a may have the same shape of unevenness as the upper surface 178 of the bottom electrode. For example, if the bottom electrode 150a is formed in a V-shape, the lower surface of the poly oxide layer 160a may be also formed in a V-shape. Alternatively, the lower surface of the poly oxide layer 160a may be formed in a V+[H]-concave shape even when the upper surface 178 of the bottom electrode 150a is in a V shape. The V+[H]-concave shape refers to a V-shape in which additional depressions, keyhole 165 is formed therein. The symbol [H] refers to the fact that the depression 165 is formed in the V-shaped concave surface to further increase the surface area. The depression, keyhole 165 is started to form by gate poly silicond deposition process, in which deposition and poly-silicon etch back process are formed after the more grows. This will be explained in detail below. The insulating layers 160a, 160b may be divided into the poly oxide layer that is formed as a part of the bottom electrode 150a is oxidized, and the gate insulating layer or a gate oxide layer that is formed as a part (e.g., silicon) of the semiconductor substrate 100a on the sidewall of the trench may be also oxidized. The insulating layer 160a, 160b may be substantially formed by the same process, and the only difference may be the target of reaction that results in the formation of the oxide layer.

The top electrode 170 is formed on the bottom electrode 150a that is formed at a lower portion inside the trench. The top electrode 170 can be effective in reducing resistance, by using poly silicon with dopant doped thereon. The thickness may be 4000~6000 Å, and the shape may be identical to the upper surface 178 of the bottom electrode 150a. Further, in one example, the lower surface of the top electrode 170 may be configured so that it gradually becomes larger toward the center portion. Like the lower surface, the upper surface of the top electrode 170 may also have a configuration with gradually increasing depth toward the center portion. As a result, the top electrode 170 may have similar upper and lower vertical thicknesses at the edges and the center. The top electrode 170 may have the same configuration as the upper surface 168 of the poly oxide layer 160a. For example, if the upper surface 168 of the poly oxide layer 160a is in a V shape, the lower surface of the top electrode 170 may also have the same, V shape. Alternatively, if the upper surface 168 of the poly oxide layer 160a is in a V+[H]-concave shape, the lower surface of the top electrode 170 may also have the same, V+[H]-concave shape. Alternatively, the lower surface of the poly oxide layer 160a may be formed in a V+[H]-concave shape even when the upper surface 178 of the bottom electrode 150a is in a V shape. Due to a V or V+[H]-concave shaped structure, the surface of the top electrode 170 increases, decreasing the resistance, and as a result, the switching speed of the semiconductor device may be increased. To maximize the area of the top electrode 170, a V+[H]-concave shaped structure is preferred. The surface area may be further increased due to using a [H]-concave shape.

The burial layers 180a, 180b that bury the trench underneath are formed on top of the top electrode 170. The burial layers 180a, 180b may include both a first burial layer 180a such as an oxide layer formed by a high temperature low pressure deposition (LPCVD), and a second burial layer 180b such as borophosphosilicate glass film formed on the first burial layer 180b, or just one of the two types of layers. The burial layers 180a, 180b are so named because the burial layers 180a, 180b bury the top electrode 170 within the trench. Alternatively, the burial layers 180a, 180b may also be referred to as first and second insulating layers.

The metal barrier layer 190 is formed on the upper surface of the semiconductor substrate 100a above the location where the burial layers 180a, 180b are formed. The metal barrier layer 190 contacts the semiconductor substrate 100a at locations where the trench is not yet formed. The structure may be necessary to inhibit the reaction of the metal electrode 200 formed on the metal barrier layer 190 with, for example, the semiconductor substrate 100a.

The metal electrode 200 is formed on the semiconductor substrate 100a above the metal barrier layer 190. To form the metal electrode 200, in this example, a conductive material such as aluminum (Al) may be coated or deposited on the semiconductor substrate 100a, and one of source and drain electrode of the semiconductor device may be formed by photolithography and etching. If the source electrode is formed by the above process, the drain electrode may be additionally formed on the rear surface of the semiconductor substrate 100a.

As a result, the semiconductor device with the constitution explained above can reduce resistance by maximizing the surface area of the gate electrode, and subsequently improve the switching speed thereof.

FIGS. 2 to 9 are cross-sectional views provided to explain an example of a fabricating process for producing the semiconductor device of FIG. 1.

Figure 2:
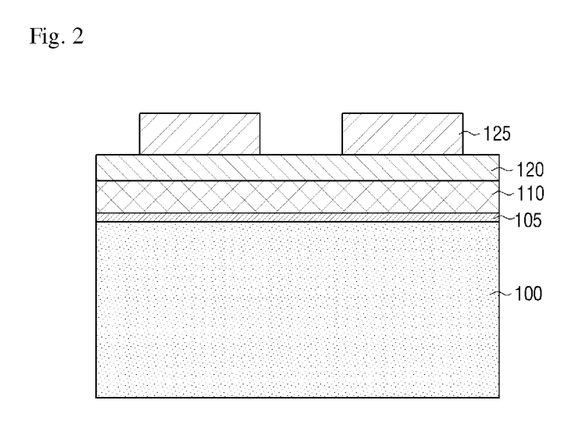
FIGS. 2 to 9 are cross-sectional views illustrating an example of a fabricating process for producing the semiconductor device illustrated in FIG. 1.

Referring to FIG. 2, according to an example of a method of forming the semiconductor device of FIG. 1, a substrate 100 is prepared. The substrate 100 may be a silicon substrate. Then, a buffer layer 105 of an oxide layer, a first insulating layer 110 of a silicon nitride layer and a second insulating layer 120 of a silicon oxide layer are deposited in sequence on top of the substrate 100, and a photoresist PR is applied on the second insulating layer 120. Then, a PR pattern 125 is formed by using a mask and light exposure and developing the pattern. The buffer layer 105 is formed between the substrate 100 and the first insulating layer 110 as an insulating layer to reduce stress during the formation of the first insulating layer 110. The second insulating layer 120 functions as an etch stop layer. In addition, by forming the second insulating layer 120 with a material different from the first insulating layer 110, it is possible to form a trench of a greater depth. That is, when the mask of the second insulating layer material 120 is used to etch the substrate 100 to form a deep trench, the second insulating layer 120 is also etched until the first insulating layer 110 is exposed. Because the first insulating layer 110 is formed from a material that is different from the second insulating layer 120, additional etching is possible even after the first insulating layer 110 is completely eliminated.

Figure 3:
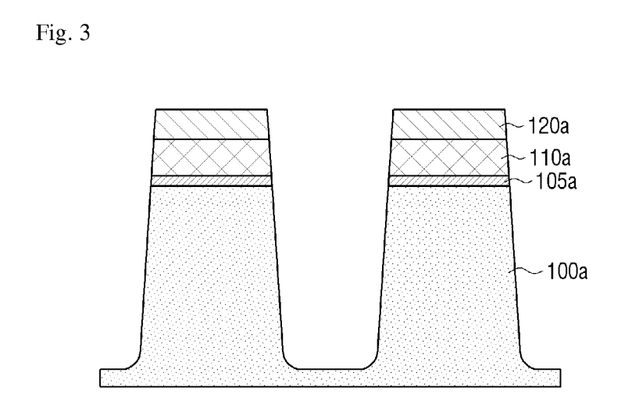

Then, as an etching process is performed according to the PR pattern 125. The etching process may be a silicon etching process. With the etching process, the insulating layers 105a, 110a, 120a are patterned as illustrated in FIG. 3, and a trench is formed in the substrate 100. In the description to follow, the substrate 100 with the trench formed therein will be referred to as the semiconductor substrate 100a with respect to this example. In the illustrated example, the trench may be formed to have a width of 0.3~0.5 µm, and a depth of 1~3 on.

Figure 4:
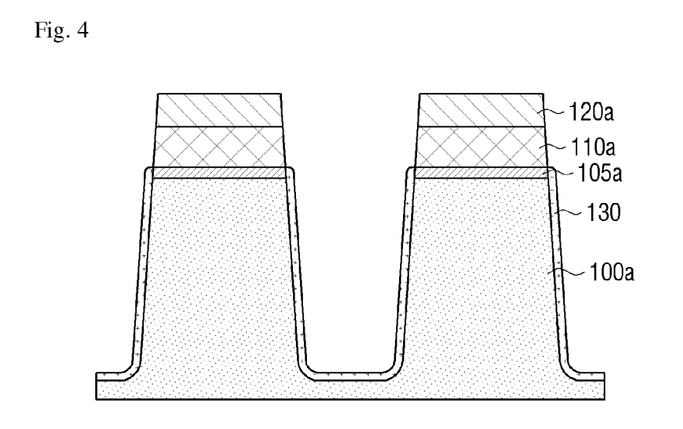

After that, the first sacrificial layer 130 is formed on the semiconductor substrate 100a with the trench, as illustrated in FIG. 4. An oxide layer may be used as the first sacrificial layer 130. The first sacrificial layer 130 is deposited on the substrate 100 by etching to remove silicon that is damaged in the process of forming the trench.

Figure 5:
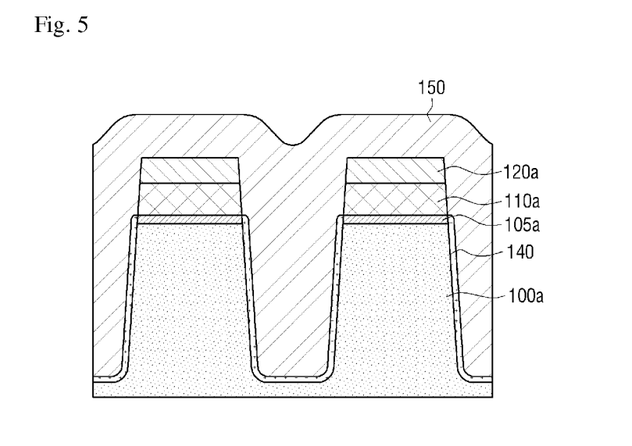

Although not illustrated in the drawings, the damaged silicon is completely eliminated in accordance with the removal of the first sacrificial layer 130 by a wet etching process. Referring to FIG. 5, the second sacrificial layer 140 is deposited on the trench. The second sacrificial layer 140 is an oxide layer that may be formed by a thermal oxidation process, and used as an insulating layer of the first conductive material 150 formed on the second sacrificial layer 140.

Referring to FIG. 5, the conductive material 150 is formed over the entire upper surface of the semiconductor substrate 100a with the second sacrificial layer 140 formed therein. In this example, the thickness of the deposited first conductive material 150 ranges between 3000~5000 Å, considering the width of the subsequent formed trench. Further, a poly silicon may be used as the first conductive material 150, and more preferably, an undoped poly silicon, rather than a doped poly silicon may be used to ensure greater resistance. When a material with greater resistance is used, the parasitic capacitance or mirror capacitance formed between the bottom poly-Si and the substrate becomes significantly smaller. Using a larger value may result in a retarded switching speed or the consumption of more power. For this reason, in this example, the bottom poly uses a undoped poly-Si.

Figure 6:
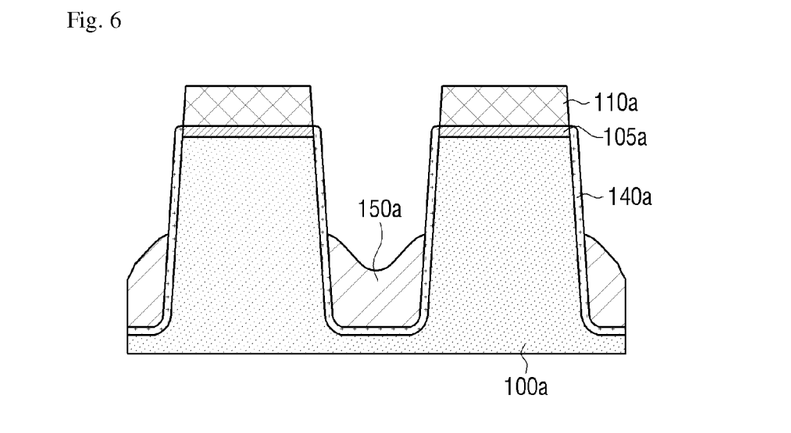

Next, referring to FIG. 6, the bottom electrode 150a located in the lower portion of the trench is formed by performing an etch-back process of the first conductive material 150. The bottom electrode 150a is so-called 'floating electrode' or 'split electrode,' an expression that indicates that the bottom electrode 150a is split from and floats on the top electrode 170. During the etch-back process, the upper surface of the bottom electrode 150a is formed into an uneven structure. Considering that the trench has a depth of 1~2 µm, the thickness of 0.5~1.5 µm is etched-back and removed. Referring to the example illustrated in FIG. 6, the center portion is more concaved than the edge portion. The formation of the concave configuration is attributable to the CVD deposition characteristic of the poly silicon. That is, when poly silicon is deposited in the trench with 1~2 µm in thickness, the deposition of the poly silicon layer begins from the side of the trench, during which the poly silicon layers grown on both sides meet at the center portion of the trench. This causes a phenomenon that the center portion has less density of poly silicon compared to the other portions. Accordingly, the etch-back speed of the poly silicon layer is faster at the center portion than the other portions, when the thickness of 0.5~1.5 µm is etched back, resulting in an overall concave configuration. In addition to overall concave configuration, a keyhole may form in center portion due to faster etching rate. Etch back process of poly silicon causes growing the size of keyhole in the center portion. The above phenomenon is not likely to occur when the trench is filled with other oxide layer material instead of poly silicon CVD.

The surface area increases due to the concave configuration. Although FIG. 2 illustrates an example in which the center portion is more concaved, the present device is not limited thereto. Further, one or more concaved portions may be formed in this step, and the concaved portion may have various configurations to obtain a larger surface area.

After that, although not illustrated in the drawings, the semiconductor substrate 100a may be washed. The washing process may be performed to remove any polymer that may have been generated during the etching process.

Figure 7:
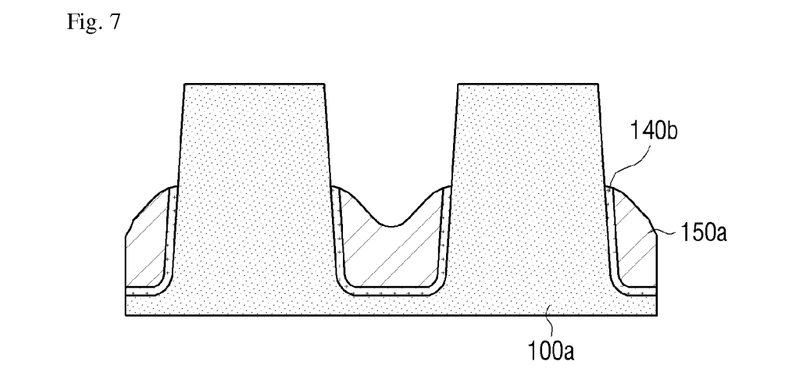

Referring to FIG. 7, the first insulating layer is removed by a phosphate solution, or the like, and the second sacrificial layer 140a is partially removed by a diluted HF solution. With a wet etching process that uses solutions like the ones mentioned above, the patterned second sacrificial layer 140a may be formed between the first conductive material 150 and the trench.

Figure 8:
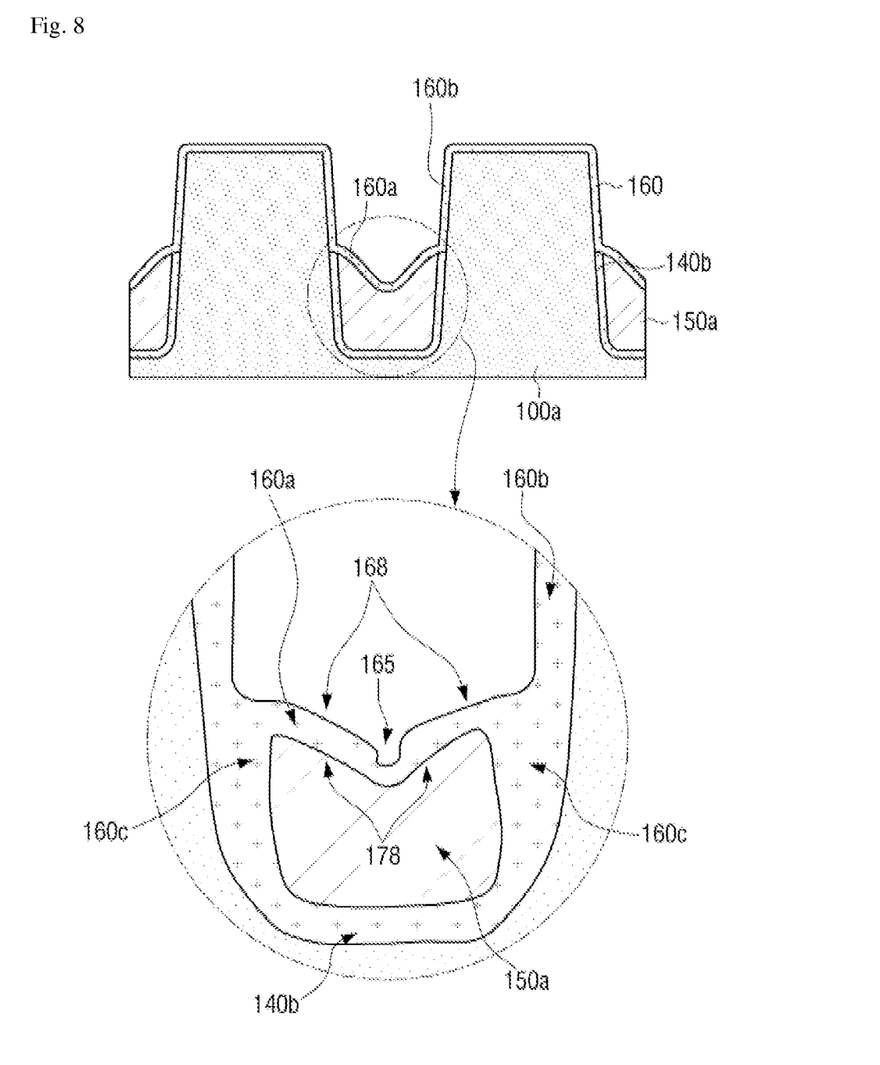

After that, referring to FIG. 8, the insulating layer, including an interlayer insulating layer of the poly oxide layer 160a and a gate insulating layer 160b, is formed on the semiconductor substrate 100a. The insulating layers 160a, 160b may use silicon oxide layer or one of silicon nitride oxide layer (SiON), and silicon nitride layer (SiN), or may be formed as a stack structure of SiO2/SiON, $SiO_2$/SiN, SiON/SiN. The thickness of the insulating layer 160 may range between 200~1000 Å. The poly oxide layer 160a may have an identical configuration as the upper surface 178 of the bottom electrode 150a. A keyhole 165 is observed after formation of the insulating layer, which is originated from the etch-back process of polysilicon.

Further, the interlayer insulating layer plays a role of insulating or isolating the bottom electrode 150a and the top electrode 170. The gate insulating layer 160b only plays a role of the gate insulating layer between the top electrode 170 and the substrate 100a.

Figure 9:
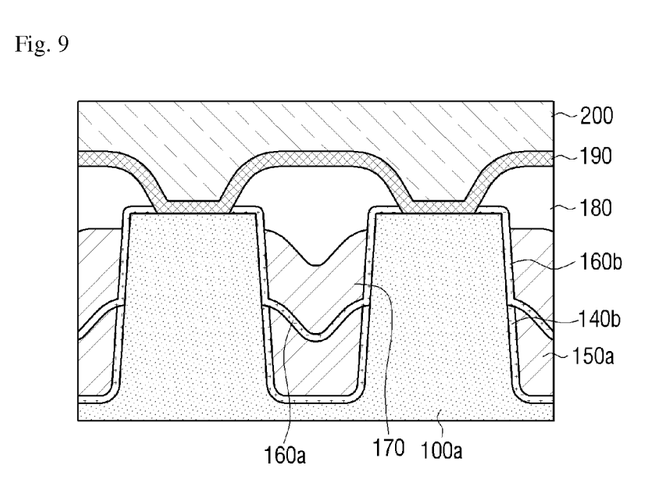

The interlayer insulating layer may be named a 'poly oxide layer 160a', because the layer is formed by thermally oxidizing a poly silicon at a high temperature ranging between 750~1000° C. To be more specific, the insulating layer 160 may be divided into the poly oxide layer 160a that is formed while the bottom electrode 150a is oxidized, and the gate insulating layer 160b that is formed while the silicon material of the semiconductor substrate 100a is oxidized. The insulating layer is substantially formed by the same process, and the only difference is the target of reaction that results in the formation of the oxide layer. The poly oxide layer 160a has a thickness equal to, or greater than the thickness of the gate oxide layer 160b. This is because the growth rate of the oxide layer is greater on the poly silicon surface than on mono-silicon. For example, if the gate insulating layer 160b is formed to 300 Å, the poly oxide layer 160a has a thickness of approximately 300~350 Å. However, as explained above, because the bottom poly or the bottom electrode 150a is undoped poly silicon, the growth rate of oxide layer is slower than the doped poly silicon. As a result, the thickness is similar to that of the gate insulating layer 160b. However, the sidewall oxide layer 160c, which is formed at a point the gate insulating layer 160b and the poly oxide layer 160a meet, is considerably thicker than the poly oxide layer 160a and the gate insulating layer 160b. This is because the oxide layers grow simultaneously on the bottom poly and trench sidewall. The presence of the thick sidewall oxide layer can further decrease the parasitic capacitance. The thicker the oxide layer becomes, the lower the capacitance value becomes. The sidewall oxide layer 160c is formed to be thicker than the sacrificial layer 140b (i.e., bottom oxide). Next, the second conductive material is deposited on the semiconductor substrate 100a to form the top electrode 170, and the top electrode 170 is formed as illustrated in FIG. 9 by the photolithography and etching process. Thus, the poly silicon doped with dopant is deposited to form the top electrode 170, and the use of the doped poly silicon can produce the effect of further reducing the resistance. Accordingly, if the bottom electrode 150a is formed with an undoped poly silicon, the top electrode 170 may be formed with a doped poly silicon.

The top electrode 170 is deposited to a thickness of approximately 4000~6000 Å. The configuration of the top electrode 170 is identical to that of the upper surface of the bottom electrode 150a. Referring to FIG. 9, the top electrode 170 is formed so that the center portion is the most concaved portion in order to provide an increased surface area of the top electrode 170 (i.e., gate poly silicon) and to reduce the resistance, and consequently to increase the switching speed of the semiconductor device. As a result of the reduction of resistance and increased switching speed, power loss may be reduced.

Although not illustrated, a source region (N+) and a body contact region (P+) may be additionally formed after the top electrode 170 is formed. To insulate the top electrode 170 from the metal materials that may be formed in subsequent processing, the burial layer is formed on the top electrode 170. At least one of LPCVD oxide layer, borophosphosilicate glass (BPSG), PSG, and TEOS films is used to form the burial layer 180. At this time, if the burial layer 180 is formed into two layers, the layer may include a first burial layer 180 such as LPCVD oxide layer and a second burial layer such as BPSG layer. Instead of BPSG layer, PSG, or PE-TEOS may be used. The burial layer 180 may be formed by applying a photolithography and etching the LPCVD oxide layer and the BPSG film deposited on the semiconductor substrate 100a.

After that, a contact hole to expose the semiconductor substrate is formed by performing a photolithography and an etching process of the EPSG film and the LPCVD oxide layer. After the contact hole is formed, a conductive material is deposited on the semiconductor substrate 100a to form a metal barrier layer 190. A conductive material such as Ti or TiN, or a mixture layer of Ti/TiN may be used. When Ti/TiN is used, TiSi2 is formed by the reaction between Ti and Si substrates, and as a result, contact resistance can further decrease. TiN is formed to prevent reaction of a material of the metal electrode 200 with the semiconductor substrate. After the metal barrier layer 190, the metal electrode 200 is then formed. At this time, aluminum, tungsten, molybdenum or copper, or a mixture of one or more of the above may be used as the material for metal electrode.

Lastly, although not illustrated, on a rear surface of the semiconductor substrate 100a in FIG. 9, an implant layer and a drain region (not illustrated) may be formed on the implant layer may be formed. The drain region forms a vertical channel between the source region and the metal electrode 200 connected thereto.

Figure 10:
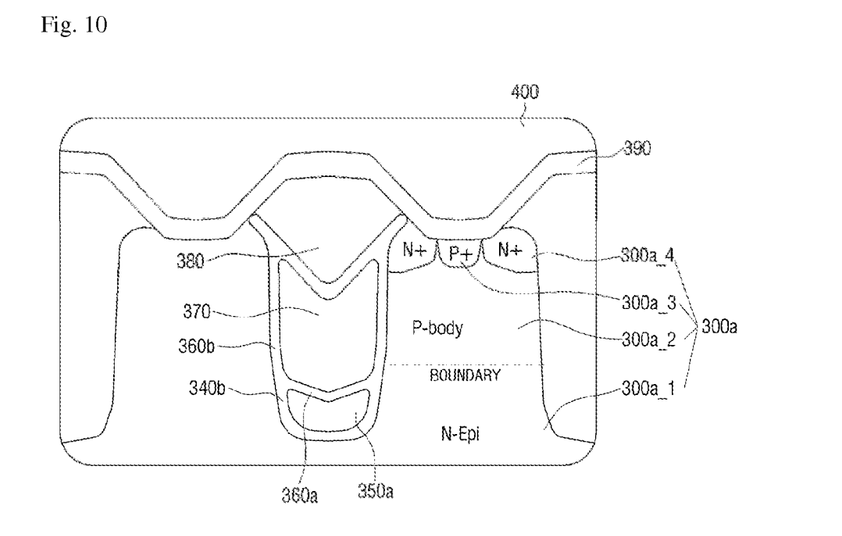
FIG. 10 is a cross-sectional view that illustrates a semiconductor device according to a second example.

FIG. 10 illustrates a semiconductor device according to a second example. Referring to FIG. 10, the dotted line represents a boundary with the PN junction.

Referring to FIG. 10, the semiconductor device according to the second example may include all of, or a portion of, a semiconductor substrate 300a, a sacrificial layer 340b, a bottom electrode 350a, insulating layers 360a, 360b, a top electrode 370, a burial layer 380, a metal barrier layer 390 and a metal electrode 400, and may additionally include a third electrode.

The expression 'include(s) all or a portion of' as used herein may be understood to indicate that a portion of the elements may be omitted. Further, the burial layer 380 may be formed into at least one layer using LPCVD oxide layer and BPGS film. Also, it is possible to use PSG, or PE-TEOS film instead of BPSG. For convenience of explanation, FIG. 10 illustrates an example in which all the elements are included.

The semiconductor device illustrated in FIG. 10 differs the example of the semiconductor device illustrated in FIG. 1 in that it includes an N-type epilayer 300a_1, a P-type body layer 300a_2, a P-type body contact region 300a_3, and an N-type source region 300a_4 formed on the semiconductor substrate 300a. The P-type body contact region 300a_3 is provided to set the voltage of the P-type body layer 300a_2. The N-type source region 300a_4 and the P-type body contact region 300a_3 are formed in contact with each other to set the same voltage simultaneously. Both the N-type source region 300a_4 and the P-type body contact region 300a_3 apply ground voltage.

The P-type body layer 300a_2 forms a channel for the electric current to flow between the N-type source region 300a_4 and the drain region formed on a rear surface of the semiconductor substrate 300a. For example, a voltage of 8~1200 V may be applied to the drain region. Further, a voltage of 2~40 V may be applied to the top electrode 370, which is a gate electrode. Thus, the different voltages are applied depending on the thickness of the gate insulating layer.

The N-type epilayer 300a_1 is arranged at a lowermost end of the semiconductor substrate 300a and may be formed on the substrate such as a wafer in the process. Further, the P-type body layer 300a_2 is formed after the N-type epilayer 300a_1 is grown.

The explanation about the technical constitutions such as the semiconductor substrate 300a, the sacrificial layer 340b, the bottom electrode 350a, the insulating layers 360a, 360b, the top electrode 370, the burial layer 380, the metal barrier layer 390 and the metal electrode 400, and the method of forming these layers, will not be repeated in detail here, because the they are similar to the respective layers illustrated in FIG. 1. The explanation provided above with reference to FIG. 1 regarding the semiconductor substrate 100a, the sacrificial layer 140b, the bottom electrode 150a, the insulating layers 160a, 160b, the top electrode 170, the burial layer 180, the metal barrier layer 190 and the metal electrode 200 may be used for these constituent.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device, comprising:
   a semiconductor substrate comprising a trench formed therein;
   a bottom electrode formed inside the trench;
   a top electrode formed inside the trench and above the bottom electrode; and
   an insulating layer separating the top electrode from the bottom electrode,
   wherein the insulating layer has an uneven upper surface, and an additional depression having a shape of a key hole with a substantially vertical sidewall is formed in the uneven upper surface;
   the top electrode has an uneven lower surface; and
   the uneven lower surface of the top electrode comprises a curved surface with a protrusion in a center portion of the trench that protrudes toward the bottom electrode to fill the additional depression having the shape of the key hole.

2. The semiconductor device of claim 1, wherein the uneven lower surface of the top electrode is inclined toward the center portion of the trench; an upper surface of the bottom electrode is inclined toward the center portion of the trench; and an upper surface of the top electrode is inclined toward the center portion of the trench.

3. The semiconductor device of claim 1, wherein the curved surface of the top electrode protrudes toward an upper uneven surface of the bottom electrode.

4. The semiconductor device of claim 1, wherein an upper surface of the bottom electrode has a center area that is depressed toward a bottom surface of the trench.

5. The semiconductor device of claim 1, wherein the bottom electrode comprises an undoped poly silicon, and the top electrode comprises a doped poly silicon.

6. The semiconductor device of claim 1, further comprising:
  a sacrificial layer formed on a bottom surface and a lower sidewall of the trench;
  a burial layer formed above the top electrode in the trench; and
  a metal barrier layer formed above the burial layer.

7. The semiconductor device of claim 6, wherein the burial layer comprises at least one of a high temperature low pressure deposition (LPCVD) oxide layer, a borophosphosilicate glass (BPSG), a phosphosilicate glass (PSG) or a tetraethoxy silane (TEOS) film.

8. The semiconductor device of claim 6, wherein the metal barrier layer comprises at least one of titanium (Ti) or titanium nitrate (TiN).

9. The semiconductor device of claim 6, wherein the metal barrier layer has a multilayer structure.

10. The semiconductor device of claim 6, further comprising a metal electrode formed on the metal barrier layer, the metal electrode comprising aluminum (Al).

11. A semiconductor device, comprising:
  a semiconductor substrate comprising a trench formed therein;
  a bottom electrode formed inside the trench;
  a top electrode formed inside the trench and above the bottom electrode;
  an insulating layer separating the top electrode from the bottom electrode and extending laterally to cover the semiconductor substrate;
  a burial layer formed above the top electrode in the trench; and
  a metal barrier layer formed above the burial layer and extending laterally to contact the semiconductor substrate via a contact hole formed in the insulating layer,
  wherein the insulating layer has an uneven upper surface, and an additional depression having a shape of a key hole with a substantially vertical sidewall is formed in the uneven upper surface; and
  the top electrode has an uneven lower surface with a protrusion in a center portion of the trench that protrudes toward the bottom electrode to fill the additional depression having the shape of the key hole.

12. The semiconductor device of claim 11, wherein the semiconductor substrate comprises, at a site where the contact hole is formed:
  a P-type body contact region contacting the metal barrier layer;
  one or more N-type source regions contacting the metal barrier layer and formed adjacent to the P-type body contact region, and having a doping characteristic different from that of the P-type body contact region;
  a body layer formed at a lower portion of the P-type body contact region and the N-type source region; and
  an epilayer formed at a lower portion of the body layer.

13. The semiconductor device of claim 12, further comprising:
  a metal electrode formed above the top electrode; and
  a drain region formed in the semiconductor substrate to form a channel between the drain region and the N-type source region.

14. The semiconductor device of claim 1, wherein the insulating layer comprises: a poly oxide layer formed on an upper surface of the bottom electrode; and a gate oxide layer formed on a sidewall of the trench.

15. The semiconductor device of claim 14, wherein the poly oxide layer comprises an uneven surface formed on the upper surface of the bottom electrode.

16. The semiconductor device of claim 14, wherein the poly oxide layer is formed during an oxidization of an upper surface of the bottom electrode, and the gate oxide layer is formed during an oxidization of the semiconductor substrate.

17. The semiconductor device of claim 14, further comprising a sidewall oxide layer formed on a sidewall of the bottom electrode within the trench.

18. The semiconductor device of claim 17, wherein the poly oxide layer has a thickness equal to, or greater than, that of the gate oxide layer, and the sidewall oxide layer has a greater thickness than the poly oxide layer and the gate oxide layer.

19. The semiconductor device of claim 17, further comprising:
  a sacrificial layer formed on a bottom surface and a lower sidewall of the trench; and
  a sacrificial bottom oxide layer that is formed on a lower surface of the bottom electrode, the sidewall oxide layer having a greater thickness than the sacrificial bottom oxide layer.

20. A method of fabricating a semiconductor device, comprising:
  forming a trench in a semiconductor substrate; and
  forming a bottom electrode inside the trench;
  forming an insulating layer on the bottom electrode, the insulating layer having an uneven surface, and an additional depression having a shape of a key hole with a substantially vertical sidewall formed in the uneven upper surface;
  and forming a top electrode such that the insulating layer is disposed between the top electrode and the bottom electrode inside the trench,
  wherein a lower surface of the top electrode comprises a curved surface with a protrusion in a center portion of the trench that protrudes toward the bottom electrode to fill the additional depression having the shape of the key hole.

21. The method of claim 20, wherein an upper surface of the top electrode is curved shape.

22. The method of claim 20, further comprising:
  forming a sacrificial layer on a bottom surface and a lower side wall of the trench before forming the bottom electrode in the trench,
  forming a burial layer above the top electrode in the trench; and
  forming a metal barrier layer above the burial layer,
  wherein the forming of the burial layer comprises forming at least one of: a high temperature low pressure deposition (LPCVD) oxide layer, a borophosphosilicate glass (BPSG), a phosphosilicate glass (PSG) or a tetraethoxy silane (TEOS) film.

23. The method of claim 22, wherein the forming of the metal barrier layer comprises forming a contact hole through a portion of the insulating layer covering the semiconductor substrate to form the metal barrier layer in contact with an exposed surface of the semiconductor substrate.

24. The method of claim 20, wherein the forming of the insulating layer on the bottom electrode comprises thermally oxidizing a polysilicon that forms the bottom electrode to form a poly oxide layer, and the key hole is formed within the poly oxide layer through an etch-back process of the polysilicon.

\* \* \* \* \*